United States Patent
Chen et al.

(10) Patent No.: US 6,828,181 B2
(45) Date of Patent: Dec. 7, 2004

(54) DUAL GATE MATERIAL PROCESS FOR CMOS TECHNOLOGIES

(75) Inventors: Jia Chen, Beacon, NY (US); Andreas E. Grassmann, Vilach (AT)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/249,800

(22) Filed: May 8, 2003

(65) Prior Publication Data

US 2004/0224451 A1 Nov. 11, 2004

(51) Int. Cl.$^7$ .......................................... H01L 21/8238

(52) U.S. Cl. ...................... 438/199; 438/200; 438/157; 438/585; 438/592; 438/301

(58) Field of Search ............................... 438/199, 200, 438/157, 158, 206, 270, 300, 301, 231, 592, 675, 585

(56) References Cited

U.S. PATENT DOCUMENTS

| | | | |
|---|---|---|---|
| 2003/0109121 A1 * | 6/2003 | Rotondaro | 438/592 |
| 2003/0137017 A1 * | 7/2003 | Hisamoto et al. | 257/407 |
| 2004/0132271 A1 * | 7/2004 | Ang et al. | 438/585 |

* cited by examiner

Primary Examiner—Matthew Smith
Assistant Examiner—Igwe U. Anya
(74) Attorney, Agent, or Firm—McGinn & Gibb, PLLC; Ira D. Blecker, Esq.

(57) ABSTRACT

A method and structure for a method of manufacturing a device having different types of transistors, wherein gates of the different types of transistors in the device comprise different materials. The method comprises depositing a silicon layer on a gate dielectric layer, depositing a first-type gate material on the silicon layer, removing the first-type gate material from areas where a second-type gate is to be formed, depositing a second-type gate material on the silicon layer in areas where the first-type gate material was removed, and simultaneously patterning the first-type gate material and the second-type gate material into first-type and second-type gates, and anneal and transform the two types of gate materials.

20 Claims, 6 Drawing Sheets

DUAL GATE MATERIAL PROCESS FOR CMOS TECHNOLOGIES

BACKGROUND OF INVENTION

The present invention generally relates to a method for manufacturing devices that utilize different types of transistors and more particularly to a process that forms all gate oxides in a single step and that simultaneously patterns all gate conductors with different materials in a single step.

Recent advances in integrated circuit chip manufacturing processes have allowed different types of transistors (N-type and P-type) to be simultaneously manufactured on a single chip with the gate conductors for each type formed out of different materials. This allows the integrated circuit chip's performance to increase without substantially increasing the manufacturing cost or the time needed to manufacture the chips.

However, processes for producing the integrated circuit chips that utilize multiple types of transistors with multiple gate conductor materials can still be streamlined further. For example, many common techniques perform redundant processes to chemically treat previously formed gate conductors differently to create the different types of transistors. However, besides the additional efforts involved in such chemical treatments, they only allow a limited range of possible material modifications without having negative impact on other parts of the device. In addition, some conventional techniques utilize organic film deposition methods; however, such methods often have compatibility problems with post thermal processing. In addition, some conventional processes need to grow the gate oxides separately for the different types of transistors and also need to pattern the different types of gate conductors independently.

The invention described below overcomes these problems and presents a process where the use of organic polymers is avoided, yet where the gate oxide can be formed for all transistors simultaneously and where all gate conductors with different materials for all transistors can be patterned simultaneously. By providing such a methodology, the invention reduces the cost and time needed to manufacture such multiple transistor-type chips, while at the same time increases the yield of the manufacturing process

SUMMARY OF INVENTION

Described below is a method of manufacturing a device having different types of transistors, wherein gates of the different types of transistors in the device comprise different materials. The method comprises depositing a silicon layer on a gate dielectric layer (where the gate dielectric could be thin oxide, oxynitride film/stack, or high-k dielectric) depositing a first-type gate material on the silicon layer, removing the first-type gate material from areas where a second-type gate is to be formed, depositing a second-type gate material on the silicon layer in areas where the first-type gate material was removed, and simultaneously patterning the first-type gate material and the second-type gate material into first-type and second-type gates in one single step.

The method also planarizes the first-type gate material and the second-type gate material after depositing the second-type gate material. Thus, the first-type gate material and the second-type gate material comprise a continuous layer prior to being patterned into gate conductors. The method also anneals the device after lithographic patterning and pattern transferring processes, wherein the annealing transforms (e.g., joins, combines, etc.) material from the silicon layer into the first-type gate and the second-type gate.

The process of depositing the first-type gate material comprises depositing a silicon germanium layer over the silicon layer and depositing a polysilicon layer over the silicon germanium layer. In another embodiment, a silicon germanium layer deposited with different germanium concentration leads to transistors with different threshold voltages. In other embodiments, the first-type and second-type gate materials can be multi-film stacks, for instance, a film stack with different polycrystalline grain sizes (with smaller grains at the bottom of the gate and larger grains at the top of the gate) for optimum control of gate grain sizes to improve gate depletion at small gate dimensions. In other embodiments, the first-type and second-type gate materials can be metal films and metal silicides, e.g., W and $WSi_x$, Ni and $NiSi_x$, or Ta and $TaSi_x$. The process of depositing the second-type gate material comprises depositing a doped polysilicon material. Unlike conventional dual gate material processes, the silicon layer in this invention protects the gate dielectric layer from yield or reliability losses during the removing of the first-type gate material and the depositing of the second-type gate material, thus reducing costs. The method forms the gate dielectric layer in a single process prior to forming the silicon layer.

The invention provides a process where the gate oxide can be formed for all transistors simultaneously and where all gate conductors with different materials for all transistors can be patterned simultaneously. Unlike conventional dual gate processes that pattern N-type and P-type transistors independently, this process eliminates the alignment problems involved with each resist patterning step which is especially critical at gate level as critical dimension shrinks. This also increases throughput time. By providing such a methodology, the invention reduces the cost and time needed to manufacture such multiple transistor-type chips, while at the same time increases the transistor performance, yield, and reliability of the manufacturing process.

The invention provides a process that offers the flexibility of choosing optimum gate materials for different types of transistors. For instance, N-type transistors benefit from N-type doped (Phosphors or Arsenic) polysilicon gates which give higher electron mobility and better gate activation, while poly SiGe gates improve gate depletion, hole mobility and dopant activation of P-type transistors as well as eliminate boron penetration issues in conventional boron doped poly-Si P-type gates. One can improve gate depletion, carrier mobility, dopant activation and deactivation for different types of transistors and thus improve transistor performance.

In addition, the invention provides a process to offer a tunable work function for N type and P-type transistors independently. For example, by depositing a silicon germanium layer with different germanium concentrations (e.g., 20–50%), devices with different threshold voltages can be embodied in the same chip. Unlike conventional process that uses ion implantation to tailor threshold voltage for different devices, this technique is free from dislocations generated from ion implantation, which in turn lead to increased junction leakage and static power dissipation in circuits.

BRIEF DESCRIPTION OF DRAWINGS

The invention will be better understood from the following detailed description of preferred embodiments of the invention with reference to the drawings, in which.

DETAILED DESCRIPTION

Figure 1:
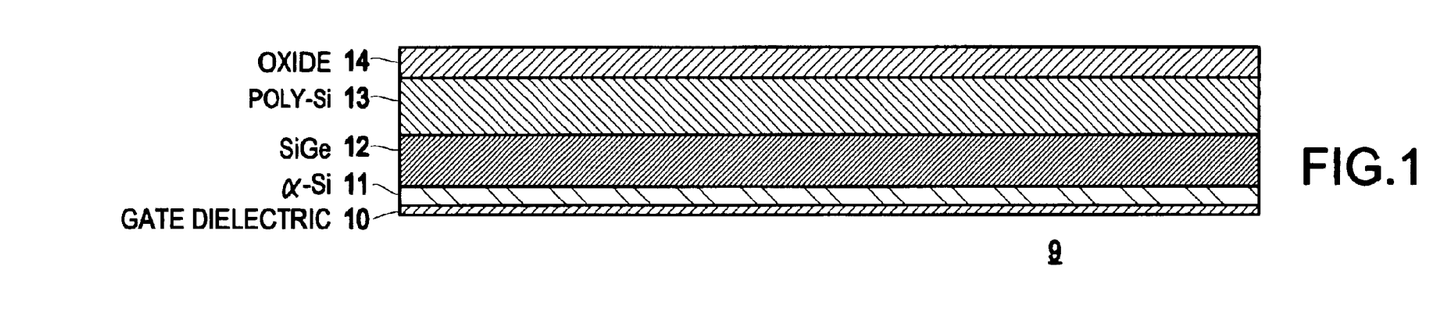
FIG. 1 is a schematic diagram of a partially completed structure according to the invention.

As mentioned above, the invention provides a process where the gate oxide can be formed for all transistors with different materials simultaneously and where all gate conductors for all transistors can be patterned simultaneously. This is shown in greater detail in the cross-sectional schematic diagrams of a portion of the integrated circuit shown in FIGS. 1–10. More specifically, FIG. 1 illustrates the gate dielectric 10 that is formed in the upper portion of the underlying substrate 9 when a gate dielectric that can be an oxide, oxynitride, or high-k dielectric (of any compatible type) is grown on the underlying substrate 9, that can be bulk silicon or silicon on insulator. An amorphous silicon layer 11, silicon germanium layer 12, and polysilicon layer 13 are then deposited, in order, over the gate dielectric 10. The invention can use any conventional deposition process such as any form of chemical vapor deposition (CVD) or physical vapor deposition (PVD) or any other commonly known deposition technique to deposit these layers. In other embodiments, a film stack with different polycrystalline grain sizes (with smaller grains at the bottom of the gate and larger grains at top of the gate); or metal films and metal silicides, (e.g., W and $WSi_x$, Ta and $TaSi_x$, or Ni and $NiSi_x$) are deposited over compatible gate dielectric 10. After this, an oxide 14 (any type compatible oxide, e.g. TEOS, or LPCVD) is grown on the polysilicon layer 13.

Figure 2:
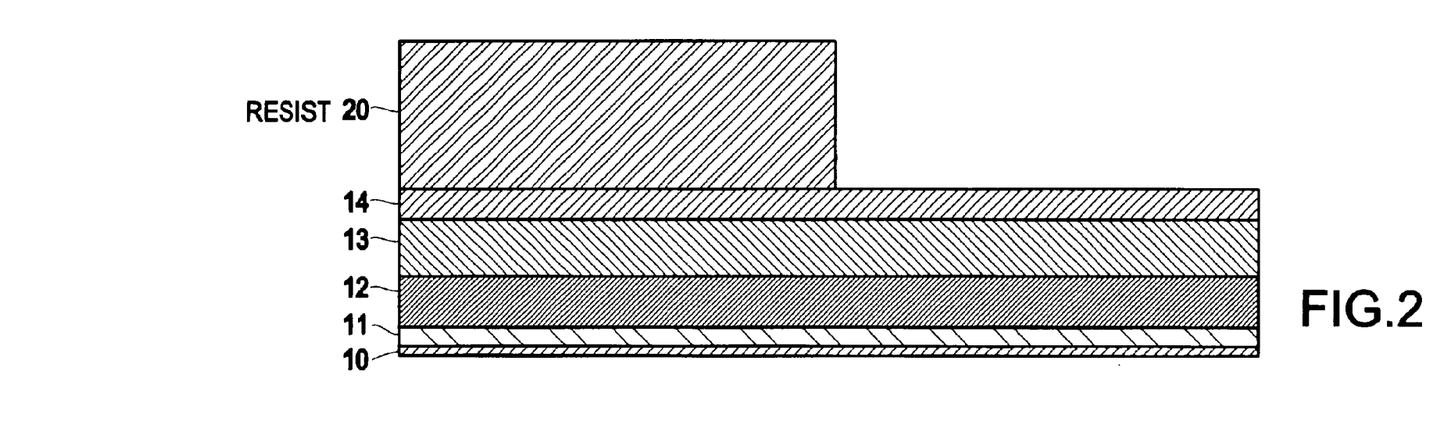
FIG. 2 is a schematic diagram of a partially completed structure according to the invention.
Figure 3:
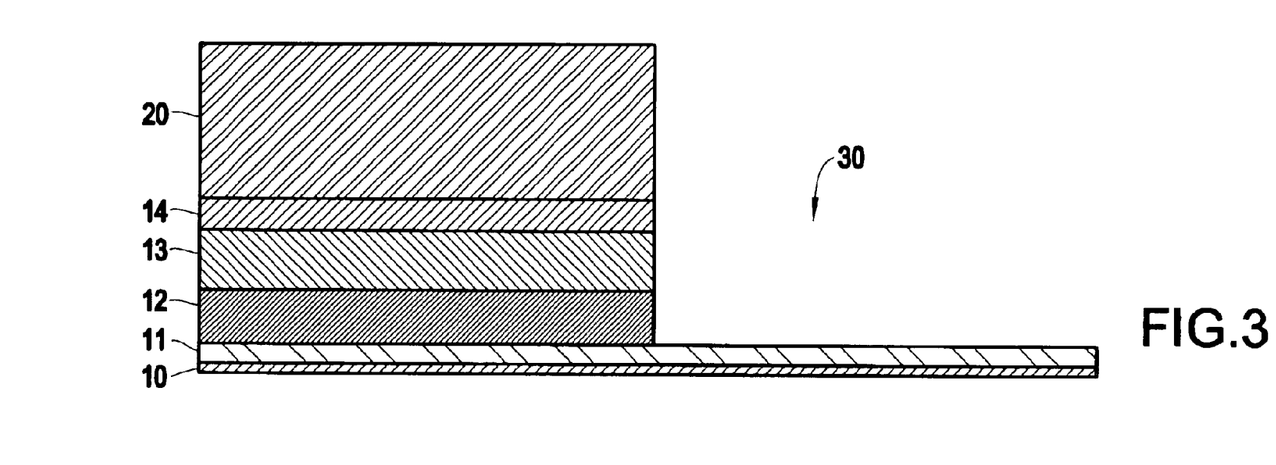
FIG. 3 is a schematic diagram of a partially completed structure according to the invention.

FIG. 2 illustrates the formation and patterning of a resist layer 20 on the oxide 14. Then, the invention performs an etching process (reactive ion etching (RIE)) to remove the portions of the oxide 14, polysilicon 13, and silicon germanium 12 (or the multi-film stack/metal film in other embodiments) that are not protected by the mask 20. The polysilicon 13 and silicon germanium 12 (or the multi-film stack/metal film in other embodiments) will eventually form one type of gate conductor. The region 30 formed by the etching process represents the area where the other type of gate conductors will be formed.

Figure 4:
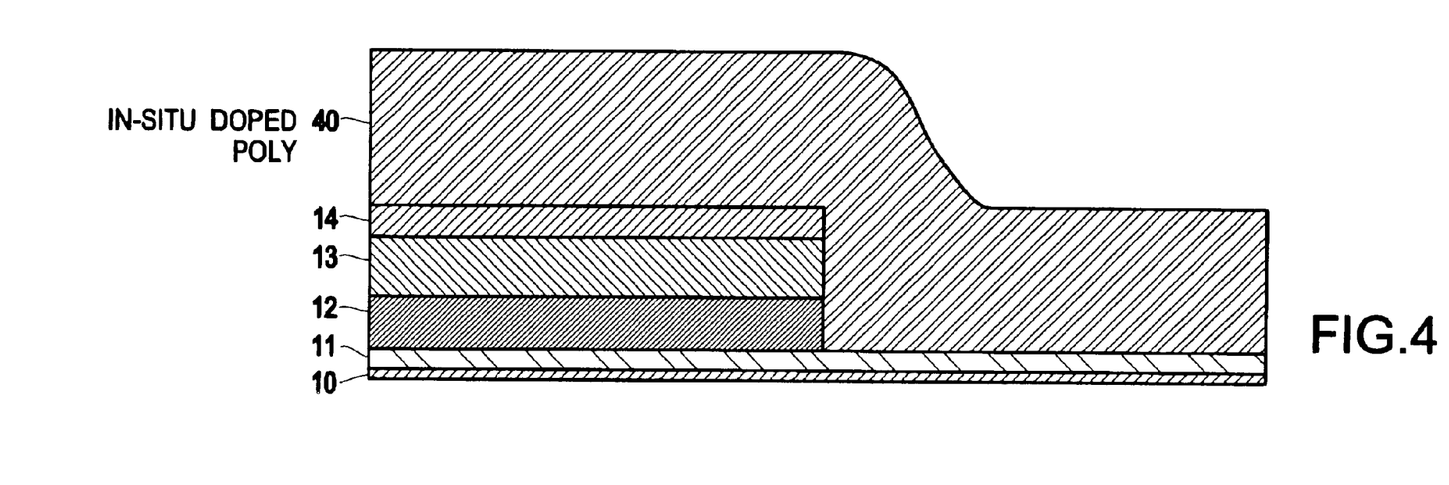
FIG. 4 is a schematic diagram of a partially completed structure according to the invention.
Figure 5:
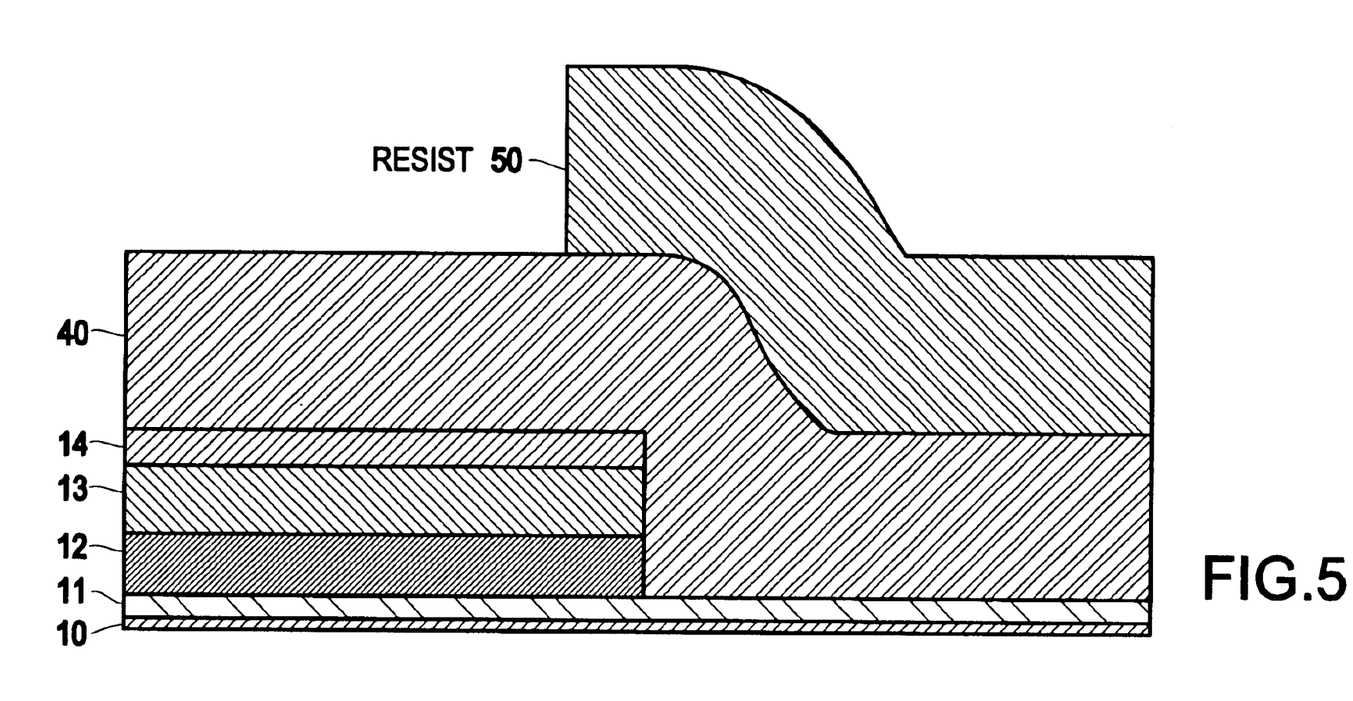
FIG. 5 is a schematic diagram of a partially completed structure according to the invention.
Figure 6:
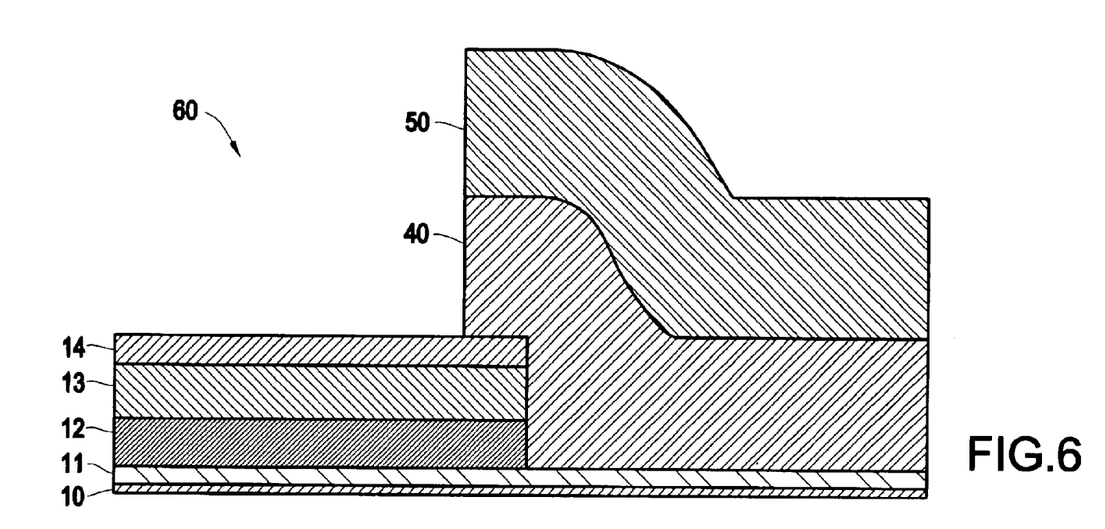
FIG. 6 is a schematic diagram of a partially completed structure according to the invention.
Figure 7:
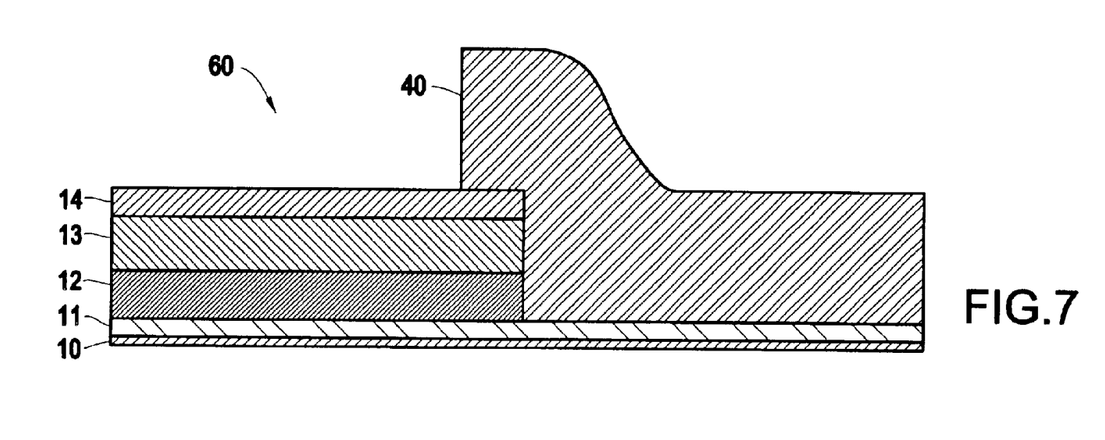
FIG. 7 is a schematic diagram of a partially completed structure according to the invention.
Figure 8:
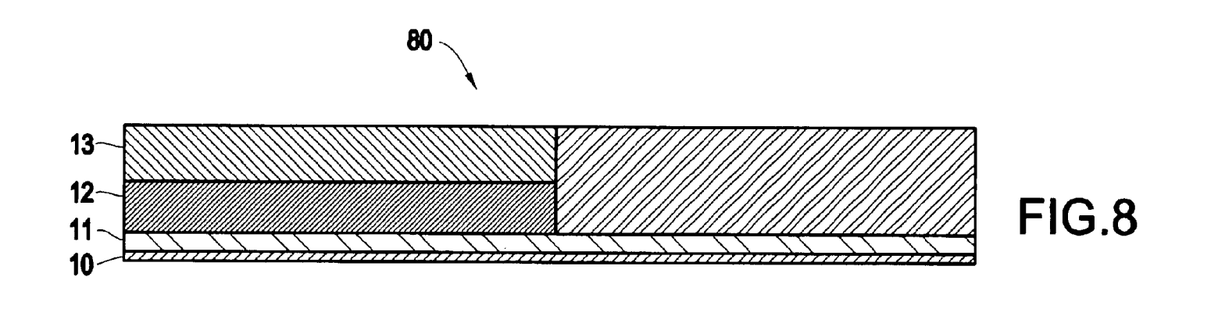
FIG. 8 is a schematic diagram of a partially completed structure according to the invention.

FIG. 4 illustrates the deposition of an in-situ doped poly silicon 40. As the name implies, the polysilicon is simultaneously doped (e.g., with phosphors) and the dopant is activated while it is deposited. Conventional single gate material deposition processes generally require 1) film deposition; 2) resist patterning to block one type of transistor that either does not need to be doped (e.g., P-type) or needs a different dopant; 3) dopant ion implantation; and 4) additional anneal for dopant activation. The in-situ doping process described in this dual material gate invention combines film deposition, doping and dopant activation in one single step, and therefore, reduces processing steps, thermal budget, costs, and manufacturing time. In other embodiments, the second-type gate material is in-situ doped metal film or metal silicides. In FIG. 5, another resist 50 is formed over the doped polysilicon 40 and in FIG. 6 another etching process is used to remove the polysilicon 40 and oxide 14 that are not protected by the mask 50. The area that is removed in FIG. 6 is represented by item 60. FIG. 7 represents the removal of the mask 50. In FIG. 8, the integrated circuit chip device is planarized using any conventional planarization techniques such as chemical mechanical polishing (CMP).

Figure 9:
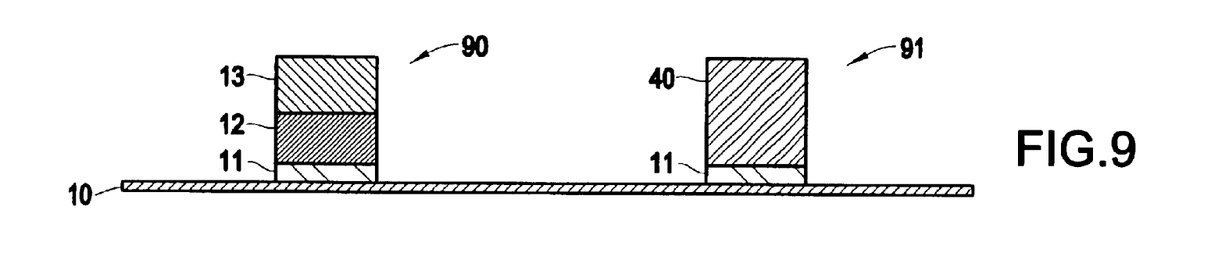
FIG. 9 is a schematic diagram of a partially completed structure according to the invention.
Figure 10:
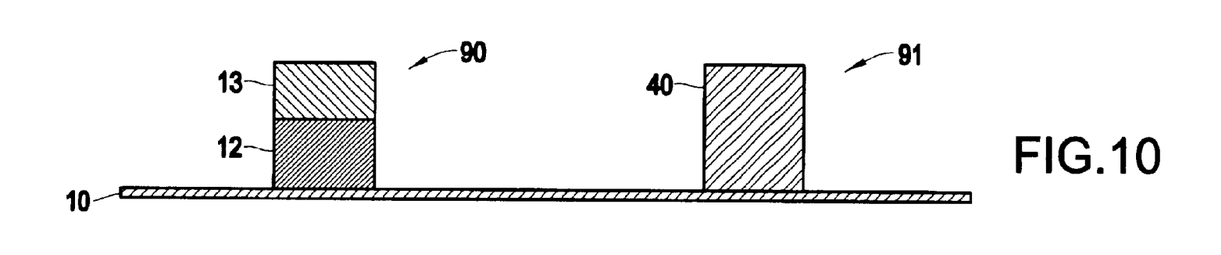
FIG. 10 is a schematic diagram of a partially completed structure according to the invention.

In FIG. 9, another mask (not shown) is formed to protect the areas where the gate conductors will remain and the remaining materials (down to the gate dielectric 10) are removed using a selective etching process to allow the gate conductors 90, 91 to remain. One feature of the invention is that both types of gates 90, 91 are formed in a single patterning process. This reduces the number of manufacturing steps when compared to conventional processes that treat the gate conductors differently. It avoids the introduction of significant overlay errors in conventional processes especially when critical gate dimensions are being continuously scaled down (e.g., below 60 nm). FIG. 10 illustrates the structure after an annealing process, e.g., Rapid Thermal Anneal or Spike Anneal for example, using rapid thermal anneal (above 1000C. for five seconds), or spike anneal at 1000 to 1100C. In another embodiment, different types of transistors are annealed in a different environments (e.g., Ar or $N_2$) to tailor threshold voltages of all transistors. Since the silicon layer 11 is amorphous silicon, it is easily transformed to part of the polysilicon germanium layer 12 and the polysilicon layer 40 in each of the gate conductors 90, 91 under the above-mentioned thermal processes.

Figure 11:
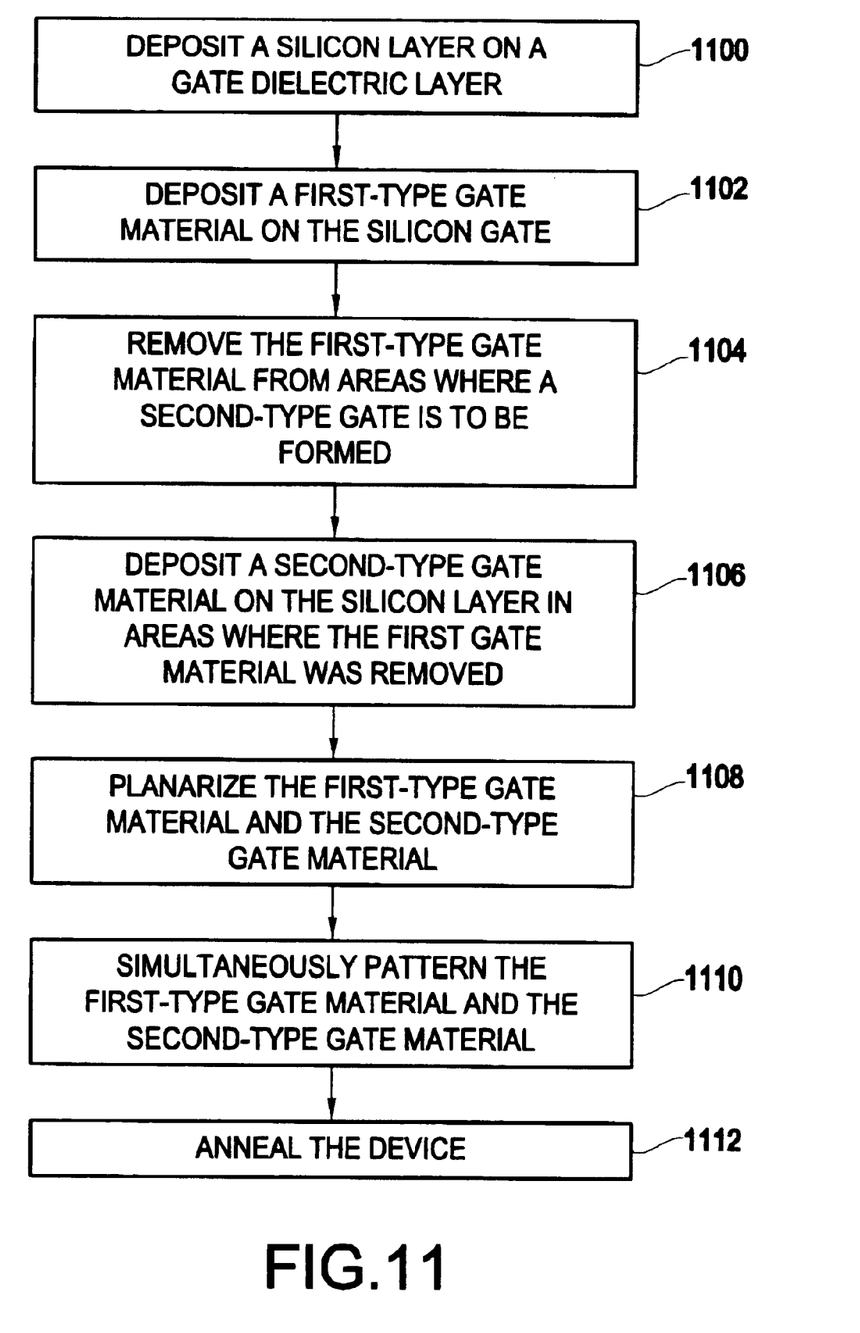
FIG. 11 is a flow diagram illustrating a preferred method of the invention.

Therefore, as shown in FIG. 11, the invention provides a method of manufacturing a device having different types of transistors, wherein gates of the different types of transistors in the device comprise different materials. The method begins by depositing a silicon layer on a gate dielectric layer 1100 and depositing a first-type gate material on the silicon layer 1102. The method forms the gate dielectric layer in a single process prior to forming the silicon layer. The process of depositing the first-type gate material comprises depositing a silicon germanium layer over the silicon layer and depositing a polysilicon layer over the silicon germanium layer. In other embodiments, it comprises depositing a film stack with or without different/grading polycrystalline grain sizes (with smaller grains at bottom of gate and larger grains at top of gate), which helps to reduce carrier depletion in particular at small gate dimensions; or metal films and metal silicides, (e.g., W and $Wsi_x$, or Ni and $NiSi_x$).

The invention then removes the first-type gate material from areas where a second-type gate is to be formed 1104 and deposits a second-type gate material on the silicon layer in areas where the first-type gate material was removed 1106. The process of depositing the second-type gate material comprises in-situ depositing a doped polysilicon material. In other embodiments, the second-type gate material comprises in-situ depositing multi-film poly silicon or doped metal film or metal silicides. The silicon layer protects the gate dielectric layer during the removing of the first-type gate material and the depositing of the second-type gate material.

The method also planarizes the first-type gate material and the second-type gate material after depositing the second-type gate material 1108. Thus, the first-type gate material and the second-type gate material comprise a continuous layer prior to the gate patterning process. The invention simultaneously patterns the first-type gate material and the second-type gate material into the first- and second-type gates 1110. The method also anneals the device after the patterning process 1112. The annealing transforms material from the silicon layer into the first-type gate and the second-gate (under various environments).

Thus, as shown above, the invention provides a process where the gate dielectric can be formed for all transistors simultaneously and where all gate conductors with different materials for all transistors can be patterned simultaneously. By providing such a methodology, the invention reduces the cost and time needed to manufacture such multiple transistor-type chips, while at the same time increases the yield of the manufacturing process.

In addition, the invention provides a process to offer the flexibility of choosing optimum gate materials for different types of transistors; eliminates transistor performance limitations caused by carrier depletion and dopant penetration; and offers a tunable work function/threshold voltage for all transistors independently on the same chip. Another benefit of this invention is that the gate material of both types of transistors can be optimized independently without significantly adding complexity to the manufacturing process. In addition, the gate materials can be tailored for minimum gate depletion, which gives rise to higher effective electric field through the gate and therefore, higher achievable on-state current of the device. The threshold voltage can be adjusted by the gate material properties, such that the implantation for threshold adjustment can be minimized. By that, the mobility of charge carriers in the channel is optimized, which results in a higher performance of the device. This can be achieved without significantly adding manufacturing cost compared to the state-of-the-art manufacturing process. Thus, computer and logic circuits can be built, which are superior to current circuits, giving more speed and performance to computers, cellular phones, etc.

While the invention has been described in terms of preferred embodiments, those skilled in the art will recognize that the invention can be practiced with modification within the spirit and scope of the appended claims.

What is claimed is:

1. A method of manufacturing a device having different types of transistors, wherein gates of said different types of transistors in said device comprise different materials, said method comprising:
   depositing a silicon layer on a gate dielectric layer;
   depositing a first-type gate material on said silicon layer;
   removing said first-type gate material from areas where at least one second-type gate is to be formed;
   depositing a second-type gate material on said silicon layer in areas where said first-type gate material was removed in said removing process;
   planarizing said first-type gate material and said second-type gate material; and
   simultaneously patterning said first-type gate material and said second-type gate material into at least one first-type gate and said at least one second-type gate.

2. The method in claim 1, further comprsing annealing said device after said patterning process, wherein said annealing joins said silicon layer with said first-type gate material and said second-gate material.

3. The method in claim 1, wherein said process of depositing said first-type gate material comprises depositing a silicon germanium layer over said silicon layer and depositing a polysilicon layer over said silicon germanium layer.

4. The method in claim 1, wherein said process of depositing said second-type gate material comprises depositing a doped polysilicon material.

5. The method in claim 1, wherein said silicon layer protects said gate dielectric layer during said removing of said first-type gate material and said depositing of said second-type gate material.

6. The method in claim 1 further comprising forming said gate dielectric layer in a single process prior to forming said silicon layer.

7. The method in claim 1, wherein at least one of said process of depositing said first-type gate and said process of depositing said second-type material comprises depositing a multi-film stack with uniform grain size.

8. The method in claim 1, wherein said process of depositing said first-type gate comprises depositing a metal film over a liner layer on said silicon layer and depositing a metal silicide film over said metal film.

9. The method in claim 1, wherein said process of depositing said second-type gate comprises depositing a metal film under a predetermined gas environment over a liner layer on said silicon layer and depositing a metal silicide film over said metal film.

10. The method in claim 1, wherein said process of depositing said second-type gate material comprises in-situ depositing a doped polysilicon material, wherein dopant in said doped polysilicon material is activated during deposition.

11. The method in claim 1, wherein said first-type of gate material and said second type of gate material have tunable work functions with concentrations of 20–50% germanium.

12. The method in claim 1, further comprising annealing said device after said patterning process in a predetermined environment, wherein said annealing joins material from said silicon layer with said first-type gate and said second-gate.

13. A method of manufacturing a device having different types of transistors, wherein gates of said different types of transistors in said device comprise different material, said method comprising:
   depositing a silicon layer on at gate dielectric layer;
   depositing a first-type gate material on said silicon layer;
   removing said first-type gate material from areas where at least one second-type gate is to be formed;
   depositing a second-type gate material on said silicon layer in areas where said first-type gate material was removed in said removing process;
   planarizing said first-type gate material and said second-type gate material after depositing said second-type gate material, wherein said first-type gate material and said second-type gate material comprise a continuous layer prior to said patterning process; and
   simultaneously patterning said first-type gate material and said second-type gate material into at least one first-type gate and said at least one second-type gate.

14. A method of manufacturing a device having different types of transistors, wherein gates of said different types of transistors in said device comprise different materials, said method comprising:
   depositing a silicon layer on a gate dielectric layer;
   depositing a first-type gate material on said silicon layer;
   removing said first-type gate material from areas where at least one second-type gate is to be formed;
   depositing a second type gate material an said silicon layer in areas where said first-type gate material was removed in said removing process; and simultaneously patterning said first-type gate material and said second-type gate material into at least one first-type gate and said at least one second-type gate, wherein at least one of said process of depositing said first-type gate material and said process of depositing said second-type material comprises depositing a multi-film stack with a grading grain size, wherein smaller polycrystalline grains are closer to said silicon layer than larger polysilicon grains.

15. A method of manufacturing a device having different types of transistors, wherein gates of said different types of transistors in said device comprise different materials, said method comprising:

depositing a first-type gate material on a substrate;

removing said first-type gate material from areas where at least one second-type gate is to be formed;

depositing a second-type gate material on said substrate in areas where said first-type gate material was removed in said removing process;

planarizing said first-type gate material and said second-type gate material; and simultaneously patterning said first-type gate material and said second-type gate material into at least one first-type gate and said at least one second-type gate.

16. The method in claim 15, further comprising annealing said device said patterning process.

17. The method in claim 15, wherein said process of depositing said first-type gate material comprises depositing a silicon germanium layer and depositing a polysilicon layer over said silicon germanium layer.

18. The method in claim 15, wherein said process of depositing said second-type gate material comprises depositing a doped polysilicon material.

19. The method in claim 15, wherein depositing said first-type gate material comprises depositing a multi-stack metal film on gate dielectric.

20. A method of manufacturing a device having different types of transistors, wherein gates of said different types of transistors in said device comprise different materials, said method comprising:

depositing a first-type gate material on a substrate;

removing said first-type gate material from areas where at least one second-type gate is to be formed;

depositing a second-type gate material on said substrate in areas where said first-type gate material was removed in said removing process;

planarizing said first-type gate material and said second-type gate material after depositing said second-type gate material, wherein said first-type gate material and said second-type gate material comprise a continuous layer prior to said patterning process; and simultaneously patterning said first-type gate material and said second-type gate material into at least one first-type gate and said at least one second-type gate.

* * * * *